United States Patent
Yoon (10) Patent No.: US 11,455,218 B2
(45) Date of Patent: Sep. 27, 2022

(54) MEMORY SYSTEM

(71) Applicant: SK hynix Inc., Gyeonggi-do (KR)

(72) Inventor: Hyun-Ju Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 344 days.

(21) Appl. No.: 16/676,144

(22) Filed: Nov. 6, 2019

(65) Prior Publication Data

US 2020/0233759 A1 Jul. 23, 2020

(30) Foreign Application Priority Data

Jan. 22, 2019 (KR) .................. 10-2019-0008176

(51) Int. Cl.

| | |
|---|---|
| *G06F 11/00* | (2006.01) |
| *G06F 11/20* | (2006.01) |
| *G06F 11/10* | (2006.01) |
| *G06F 11/14* | (2006.01) |
| *G11C 29/00* | (2006.01) |
| *G11C 29/42* | (2006.01) |
| *G11C 29/18* | (2006.01) |

(52) U.S. Cl.
CPC ...... *G06F 11/2017* (2013.01); *G06F 11/1092* (2013.01); *G06F 11/1461* (2013.01); *G06F 11/1469* (2013.01); *G11C 29/18* (2013.01); *G11C 29/42* (2013.01); *G11C 29/76* (2013.01); *G11C 2029/1802* (2013.01)

(58) Field of Classification Search
CPC ............. G06F 11/2017; G06F 11/1092; G06F 11/1461; G06F 11/1469; G06F 11/0727; G06F 11/073; G06F 11/10; G11C 29/18; G11C 29/42; G11C 29/76; G11C 2029/1802

See application file for complete search history.

(56) References Cited

U.S. PATENT DOCUMENTS

| | | | | |
|---|---|---|---|---|
| 2009/0144583 | A1* | 6/2009 | Bruennert | G11C 29/44 714/6.32 |
| 2017/0199703 | A1* | 7/2017 | Ravimohan | G06F 3/0659 |
| 2019/0258538 | A1* | 8/2019 | Byun | G06F 11/1048 |
| 2020/0117558 | A1* | 4/2020 | Wilson | G06F 11/0751 |

FOREIGN PATENT DOCUMENTS

| | | |
|---|---|---|
| KR | 10-1994-0010100 | 5/1994 |
| KR | 10-2018-0042488 | 4/2018 |

\* cited by examiner

*Primary Examiner* — Joseph D Manoskey
(74) *Attorney, Agent, or Firm* — IP & T Group LLP (57) ABSTRACT

A main memory includes unit memory regions, a redundancy memory region for replacing one or more of the unit memory regions, an address wrapper for generating an address increase/decrease control signal in first and second address wrapping modes, a column decoder for sequentially selecting memory cells in a faulty memory region where a fault has occurred, among the unit memory regions in the first address wrapping mode, and sequentially selecting redundancy memory cells in the redundancy memory region in the second address wrapping mode, based on a column address and the address increase/decrease control signal, and a data input/output circuit for outputting data read from the faulty memory region as backup data to a temporary memory in the first address wrapping mode, and outputting the backup data as restoration data to the redundancy memory region in the second address wrapping mode.

15 Claims, 5 Drawing Sheets

MEMORY SYSTEM

CROSS-REFERENCE TO RELATED APPLICATION

This application claims priority under 35 U.S.C. § 119 to Korean Patent Application Nos. 10-2019-0008176, filed on Jan. 22, 2019, the disclosure of which is incorporated herein by reference in its entirety.

BACKGROUND

1. Field

Various embodiments relate to a semiconductor design technique, and more particularly, to a memory system including a main memory capable of performing a repair operation.

2. Description of the Related Art

When a fault occurs in a unit memory region, a memory can replace the faulty unit memory region with a redundancy memory region. The memory can normally operate by backing up and restoring data stored in the faulty unit memory region.

SUMMARY

Various embodiments are directed to a main memory that supports an address wrapping mode for backing up and restoring data, a memory system including the main memory, and an operating method of the memory system.

In accordance with an embodiment, a main memory includes: a plurality of unit memory regions; a redundancy memory region suitable for replacing one or more of the plurality of unit memory regions; an address wrapper suitable for generating an address increase/decrease control signal in a first address wrapping mode and a second address wrapping mode; a column decoder suitable for sequentially selecting a plurality of memory cells in a faulty memory region where a fault has occurred, among the plurality of unit memory regions, in the first address wrapping mode, and sequentially selecting a plurality of redundancy memory cells in the redundancy memory region in the second address wrapping mode, based on a column address and the address increase/decrease control signal; and a data input/output circuit suitable for outputting data read from the faulty memory region, as backup data to a temporary memory in the first address wrapping mode, and outputting the backup data received from the temporary memory as restoration data to the redundancy memory region in the second address wrapping mode.

The column decoder first may select a faulty memory cell among the plurality of memory cells based on the column address and sequentially select the other memory cells by automatically increasing/decreasing the column address in response to the address increase/decrease control signal, in the first address wrapping mode. The column decoder first may select a redundancy memory cell corresponding to the faulty memory cell among the plurality of redundancy memory cells based on the column address and sequentially select the other redundancy memory cells by automatically increasing/decreasing the column address in response to the address increase/decrease control signal, in the second address wrapping mode.

The main memory may further include: a row decoder suitable for generating a row selection signal; and a post package repair (PPR) processor suitable for selecting, based on the row selection signal, the faulty memory region in the first address wrapping mode and the redundancy memory region in the second address wrapping mode.

The PPR processor may replace a row address of the faulty memory region with a row address of the redundancy memory region in a PPR mode.

Each of the unit memory regions and the redundancy memory region may include a plurality of memory cells arranged at one or more rows.

In accordance with an embodiment, a memory system includes: a main memory suitable for reading, in a first address wrapping mode, all data of a faulty memory region including a faulty memory cell among a plurality of unit memory regions, as backup data based on a specific address of the faulty memory cell and writing, in a second address wrapping mode, the backup data as restoration data to a redundancy memory region based on the specific address; and a controller suitable for providing the main memory with the specific address in the first and second wrapping modes.

The main memory first may select the faulty memory cell based on the specific address, and sequentially select other memory cells within the faulty memory region by automatically increasing or decreasing an address value starting from the specific address, in the first address wrapping mode.

The main memory first may select a redundancy memory cell corresponding to the faulty memory cell within the redundancy memory region based on the specific address, and sequentially select other redundancy memory cells within the redundancy memory region by automatically increasing or decreasing an address value from the specific address, in the second address wrapping mode.

The specific address may include a specific column address.

The main memory may replace a row address of the faulty memory region with a row address of the redundancy memory region in a post package repair (PPR) mode.

The memory system may further include: a temporary memory suitable for temporarily storing the backup data under the control of the controller.

The memory system may further include: an error correction code (ECC) engine suitable for generating ECC information indicating whether the fault is present.

The controller may include: an address storing circuit suitable for storing the specific address; an address wrapping control circuit suitable for detecting the faulty memory cell based on read data and ECC information, and controlling a backup operation and a restoration operation of the main memory according to the detection result; and a PPR control circuit suitable for controlling the main memory device to perform a post package repair (PPR) operation between the backup operation and the restoration operation.

Each of the unit memory regions and the redundancy memory region may include a plurality of memory cells arranged at one or more rows.

In accordance with an embodiment, an operating method of a memory system includes: reading all data of a faulty memory region including a faulty memory cell as backup data by automatically increasing/decreasing a value starting from an address of the faulty memory cell; replacing the faulty memory region with a redundancy memory region; and writing the backup data as restoration data to the redundancy memory region by automatically increasing/ decreasing the value starting from the address of the faulty memory cell.

The main memory first may select the faulty memory cell and sequentially select other memory cells within the faulty memory region. The main memory first may select a redundancy memory cell corresponding to the faulty memory cell within the redundancy memory region, and sequentially select other redundancy memory cells within the redundancy memory region.

The address may include one column address.

The operating method may further include: storing the backup data.

The operating method further include: detecting the faulty memory cell based on read data and ECC information.

In accordance with an embodiment, a memory device includes: a cell array; an address wrapper configured to generate an address increase/decrease control signal; column decoding circuitry configured to sequentially select cells of a row based on a column address representing a specific cell among the cells of the row and the address increase/decrease control signal; and data input/output circuitry configured to perform at least one of a backup operation and a restoration operation on the selected cells.

In accordance with an embodiment, a memory device includes: a cell array; an address wrapper configured to generate an address increase/decrease control signal; column decoding circuitry configured to sequentially select cells of first and second rows based on a column address representing one of the cells of the first and second rows and the address increase/decrease control signal; row decoding circuitry configured to select one of addresses of the first and second rows; and data input/output circuitry configured to output read data from the selected cells of the first row and provide the selected cells of the second rows with write data.

In accordance with an embodiment, an operating method of a memory device includes: sequentially selecting cells of a row based on a column address representing one among the cells of the row; and outputting read data from the selected cells in a backup operation or providing the selected cells with write data in a restoration operation.

In accordance with an embodiment, an operating method of a memory device includes: sequentially selecting cells of first and second rows based on a column address representing one of the cells among the cells of the first and second rows; selecting one of addresses of the first and second rows; and outputting read data from the selected cells of the first row; and providing the selected cells of the second rows with write data.

DETAILED DESCRIPTION

Various embodiments are described below in more detail with reference to the accompanying drawings. These embodiments are provided so that this disclosure is thorough and complete, and fully conveys the scope of the present disclosure to those skilled in the art. The disclosed embodiments, however, are not intended to limit the present invention. Various aspects and features of the present invention may be modified or configured differently than disclosed herein. Thus, the present invention may be embodied in other forms, which may be variations of the present disclosure. As such, the present invention is intended to embrace not only the disclosed embodiments but all modifications and variations thereof that fall within the spirit and scope of the claims. Also, throughout the specification, reference to "an embodiment," "another embodiment" or the like is not necessarily to only one embodiment, and different references to any such phrase are not necessarily to the same embodiment(s).

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

Figure 1:
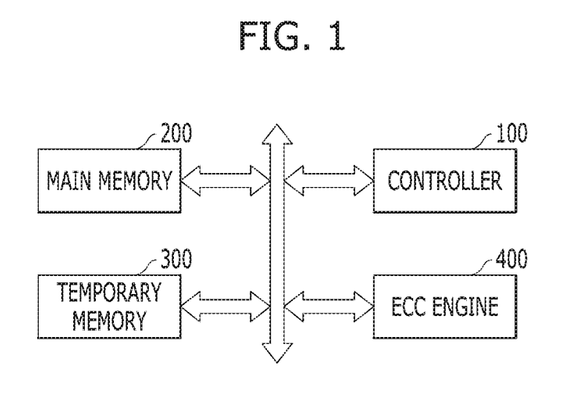
FIG. 1 is a block diagram illustrating a memory system in accordance with an embodiment of the present invention.

FIG. 1 is a block diagram illustrating a memory system in accordance with an embodiment.

Referring to FIG. 1, the memory system may include a controller 100, a main memory 200, a temporary memory 300 and an error correction code (ECC) engine 400.

The controller 100 may provide the main memory 200 with a request for a backup operation (backup request) in a first address wrapping mode, and provide the main memory 200 with a request for a restoration operation (restoration request) in a second address wrapping mode 200.

The controller 200 may provide the main memory 200 with an address of a faulty memory cell (faulty address) included in the main memory 200 at the time of the backup request and the restoration request.

The controller 100 may provide the main memory 200 with a request for a post package repair (PPR) operation (PPR request) in a PPR mode.

The controller 100 may provide the main memory 200 for a request for a read operation (read request) in a read mode.

The controller 100 may control the first and second address wrapping modes and the PPR mode based on read data outputted from the main memory 200 and ECC information outputted from the ECC engine 400 in the read mode.

For example, the controller 100 may include a central processing unit (CPU).

The main memory 200 may read all data of a faulty memory region where a fault has occurred, among a plurality of unit memory regions, as backup data in response to the backup request in the first address wrapping mode.

For example, based on the faulty address, the main memory 200 may sequentially select, among all memory cells, a plurality of memory cells included in the faulty memory region starting from the faulty memory cell, thereby reading the backup data.

The main memory 200 may write the backup data as restoration data to a redundancy memory region 213 in response to the restoration request in the second address wrapping mode.

For example, based on the faulty address, the main memory 200 may sequentially select, from among all redundancy memory cells, a plurality of redundancy memory cells included in the redundancy memory region 213 starting from a redundancy memory cell corresponding to the faulty memory cell, thereby writing the backup data.

The main memory 200 may replace a row address of the faulty memory region with a row address of the redundancy memory region 213 in the PPR mode.

The main memory 200 may output the read data to the controller 100 in the read mode.

For example, the main memory 200 may include a dynamic random access memory (DRAM).

The temporary memory 300 may temporarily store the backup data under the control of the controller 100 in the first address wrapping mode.

For example, the temporary memory 300 may include a static random access memory (SRAM).

The ECC engine 400 may generate the ECC information indicating whether the read data is faulty in the read mode.

Figure 2:
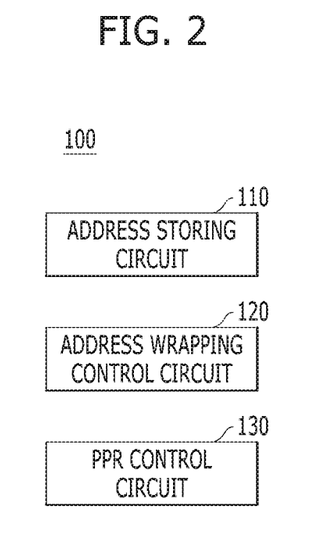
FIG. 2 is a block diagram illustrating a controller, such as that shown in FIG. 1.

FIG. 2 is a block diagram illustrating the controller 100 shown in FIG. 1.

Referring to FIG. 2, the controller 100 may include an address storing circuit 110, an address wrapping control circuit 120 and a PPR control circuit 130.

The address storing circuit 110 may store the faulty address. For example, the faulty address may include row and column addresses that indicate the faulty memory cell.

The address wrapping control circuit 120 may detect the faulty memory cell based on the read data and the ECC information, and control the backup operation and the restoration operation of the main memory 200 according to the detection result.

The PPR control circuit 130 may control the main memory 200 to perform the PPR operation between the backup operation and the restoration operation. In other words, the main memory 200 may enter and exit from each mode in order of the first address wrapping mode, the PPR mode and the second address wrapping mode in response to the backup request, the PPR request and the restoration request.

Figure 3:
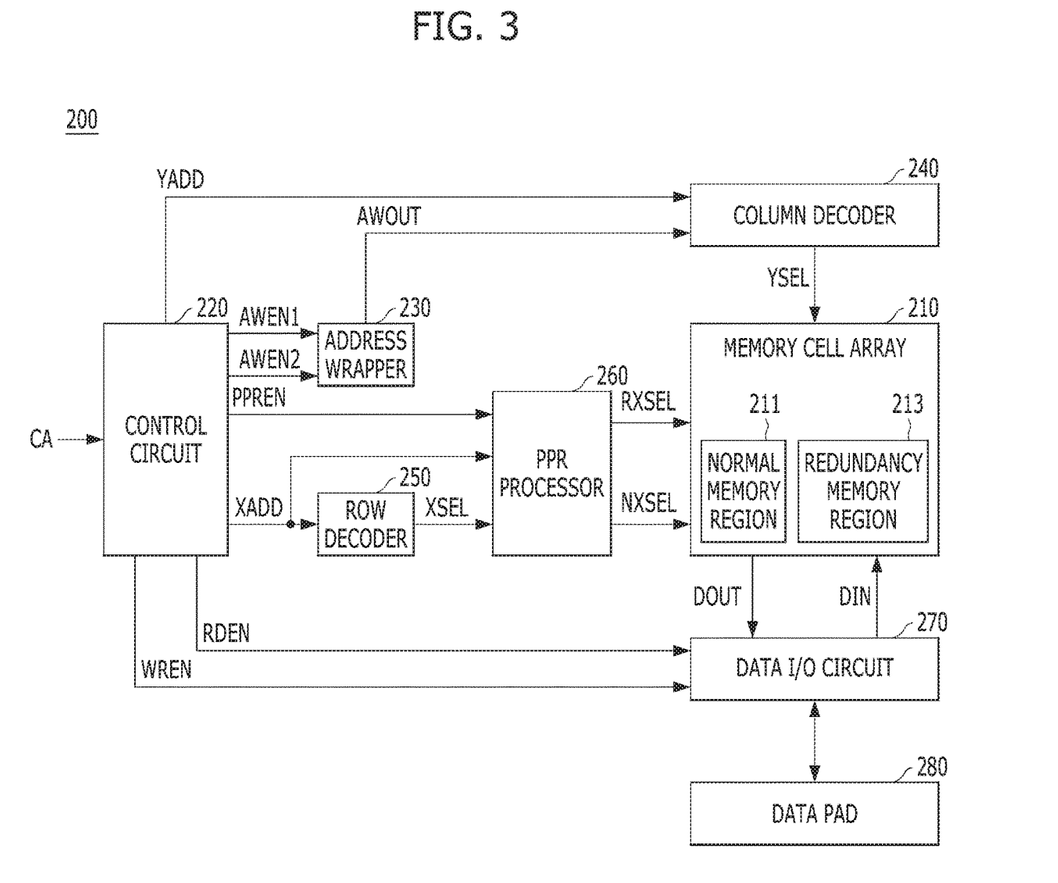
FIG. 3 is a block diagram illustrating a main memory, such as that shown in FIG. 1.

FIG. 3 is a block diagram illustrating the main memory 200 shown in FIG. 1.

Referring to FIG. 3, the main memory 200 may include a memory cell array 210, a control circuit 220, an address wrapper 230, a column decoder 240, a row decoder 250, a PPR processor 260, a data input/output circuit 270 and a data pad 280.

The memory cell array 210 may include a normal memory region 211 and a redundancy memory region 213. The normal memory region 211 may include the plurality of unit memory regions. The plurality of unit memory regions and the redundancy memory region 213 may include a plurality of memory cells arranged in one or more rows. The redundancy memory region 213 may replace one or more of the plurality of unit memory regions.

The control circuit 220 may generate a column address YADD, a row address XADD, a first address wrapping control signal AWEN1, a second address wrapping control signal AWEN2, a PPR control signal PPREN, a read control signal RDEN and a write control signal WREN based on a command/address signal CA.

The first address wrapping control signal AWEN1 may be activated in the first address wrapping mode. The first address wrapping mode may be assigned as one of a plurality of test modes.

The second address wrapping control signal AWEN2 may be activated in the second address wrapping mode. The second address wrapping mode may be assigned as another one of the plurality of test modes.

The PPR control signal PPREN may be activated in the PPR mode.

The read control signal RDEN may be activated in the first address wrapping mode and the read mode.

The write control signal WREN may be activated in the second address wrapping mode.

The command/address signal CA may be generated from the controller 100.

The address wrapper 230 may generate an address increase/decrease control signal AWOUT based on the first and second address wrapping control signals AWEN1 and AWEN2, in the first and second address wrapping modes. The address increase/decrease control signal AWOUT may be a signal for sequentially increasing the column address YADD from the column address YADD having the minimum value to the column address YADD having the end value 'n−1' after the column address YADD having the start value 'n' is sequentially increased to reach the maximum value. As exemplified in FIGS. 5 and 6, when the column address YADD having values 'n−8' to 'n+7' represents data Dn−8 to Dn+7 of a unit memory region or a redundancy memory region and the column address YADD of the value 'n' is the faulty address representing faulty data Dn, the column address YADD having the start value 'n' may be the faulty address and the address increase/decrease control signal AWOUT may control the value of the column address YADD to sequentially increase from the minimum value 'n−8' to the end value 'n−1' after the value 'n' of the column address YADD is sequentially increased to reach the maximum value 'n+7'.

For example, the address wrapper 230 may include an address adder.

The column decoder 240 may generate a column selection signal YSEL based on the column address YADD and the address increase/decrease control signal AWOUT.

The column decoder 240 may sequentially select a plurality of memory cells included in the faulty memory region among the plurality of unit memory regions in the first address wrapping mode, and sequentially select a plurality of redundancy memory cells included in the redundancy memory region in the second address wrapping mode.

For example, the column decoder 240 may sequentially select the plurality of memory cells starting from the faulty memory cell among the plurality of memory cells in the first address wrapping mode, and sequentially select the plurality of redundancy memory cells starting from a redundancy memory cell corresponding to the faulty memory cell among the plurality of redundancy memory cells included in the redundancy memory region in the second address wrapping mode.

The row decoder 250 may generate a row selection signal XSEL based on the row address XADD. The row decoder 250 may generate the row selection signal XSEL for selecting the faulty memory region corresponding to the row address XADD in the first and second address wrapping modes, and generate the row selection signal XSEL for selecting any one region corresponding to the row address XADD among the plurality of unit memory regions in the read mode.

The PPR processor 260 may generate a redundancy row selection signal RXSEL and a normal row selection signal NXSEL based on the PPR control signal PPREN, the row selection signal XSEL and the row address XADD.

For example, the PPR processor 260 may generate the normal row selection signal NXSEL corresponding to the row selection signal XSEL in the first address wrapping mode and the read mode, and generate the redundancy row selection signal RXSEL for selecting the redundancy memory region 213 in lieu of the faulty memory region in the second address wrapping mode.

The PPR processor 260 may replace the row address of the faulty memory region with the row address of the redundancy memory region in the PPR mode.

The data input/output circuit 270 may output output data DOUT, which are read from the memory cell array 240, as the read data to the data pad 280 in the read mode, output all output data DOUT, which are read from the faulty memory region, as the backup data to the data pad 280 in the first address wrapping mode, and output the restoration data, which are inputted through the data pad 280, as input data DIN to the redundancy memory region 213 in the second address wrapping mode. Although not illustrated, the data input/output circuit 270 may include a read-related circuit that operates based on the read control signal RDEN and a write-related circuit that operates based on the write control signal WREN.

An operation of the memory system having the above-described structure in accordance with an embodiment is described below with reference to FIGS. 4 to 6.

Figure 4:
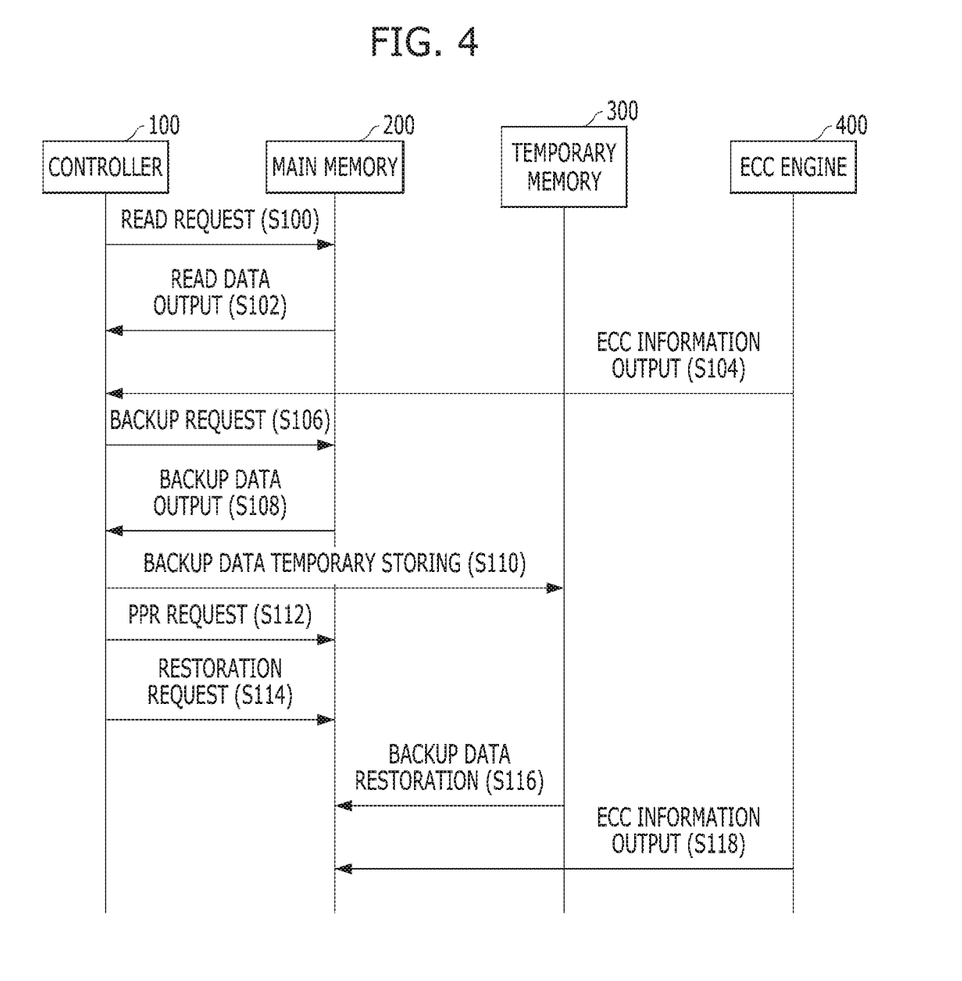
FIG. 4 is a diagram illustrating an operation of a memory system, such as that shown in FIG. 1, in accordance with an embodiment of the present invention.

FIG. 4 is a diagram illustrating an operation of the memory system shown in FIG. 1.

Referring to FIG. 4, the controller 100 requests the main memory 200 to perform the read operation according to the read mode in step S100.

The controller 100 provides the main memory 200 with the command/address signal CA including a read command and an address of a read target memory cell at the time of the read request.

The main memory 200 outputs the read data to the controller 100 in response to the read request in step S102.

The ECC engine 400 outputs ECC information to the controller 100 in step S104, the ECC information indicating whether or not the read data is faulty.

The controller 100 controls the backup operation based on the read data and the ECC information in step S106.

For example, the controller 100 requests the main memory 200 to perform the backup operation when the faulty memory cell is detected. The controller 100 provides the faulty address to the main memory 200 at the time of the request for the backup operation. The faulty address may be the address of the read target memory cell.

The main memory 200 reads all the data of the faulty memory region including the faulty memory cell as the backup data in response to the backup request in step S108.

For example, in response to the backup request, the main memory 200 may enter the first address wrapping mode, first select the faulty memory cell first among the plurality of memory cells included in the faulty memory region, and sequentially select the other memory cells, in order to read the backup data.

The temporary memory 300 temporarily stores the backup data under the control of the controller 100 in step S110.

When the backup data is stored in the temporary memory 300, the main memory 200 exits from the first address wrapping mode.

Subsequently, the controller 100 requests the main memory 200 to perform the PPR operation in step S112.

The main memory 200 enters the PPR mode in response to the PPR request, and performs a repair operation by replacing the row address of the faulty memory region with the row address of the redundancy memory region 213. When the repair operation is completed, the main memory 200 exits from the PPR mode.

The controller 100 requests the main memory 200 to perform the restoration operation in step S114.

The main memory 200 writes the backup data, which are temporarily stored in the temporary memory 300, as the restoration data to the redundancy memory region 213 in response to the restoration request in step S116.

For example, in response to the restoration request, the main memory 200 enters the second address wrapping mode, first select the redundancy memory cell corresponding to the faulty memory cell among the plurality of redundancy memory cells included in the redundancy memory region 213, and sequentially select the other redundancy memory cells, in order to write the restoration data.

The ECC engine 400 may output the ECC information to the main memory 200 in step S118, the ECC information indicating whether or not the read data is faulty.

When all of the restoration data are written, the main memory 200 exits from the second address wrapping mode.

Figure 5:
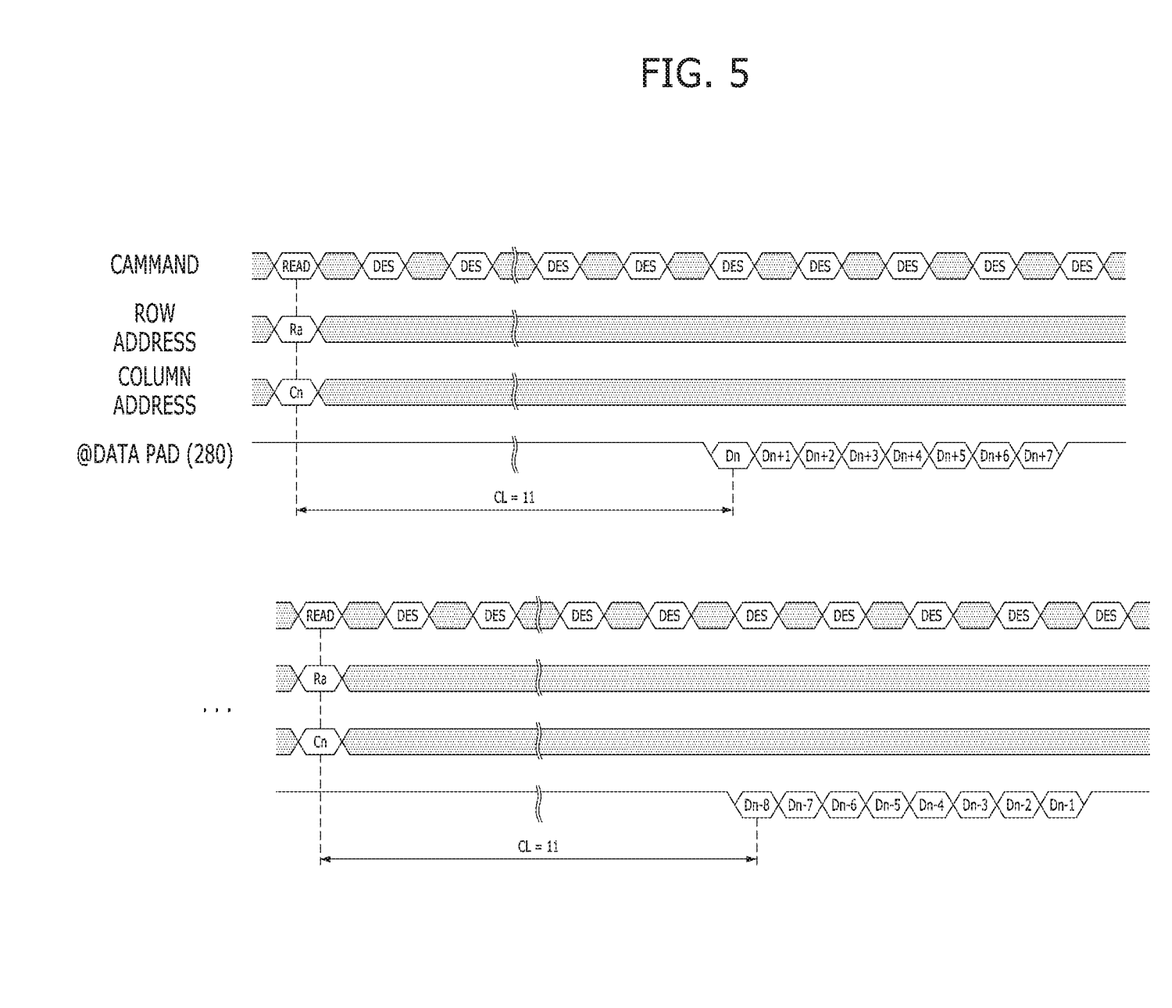
FIG. 5 is a timing diagram illustrating an operation according to a first address wrapping mode in the context of the operation illustrated in FIG. 4, in accordance with an embodiment of the present invention.

FIG. 5 is a timing diagram illustrating an operation according to the first address wrapping mode.

Referring to FIG. 5, when entering the first address wrapping mode, the controller 100 outputs the command/address signal CA to the main memory 200, the command/address signal CA corresponding to the read command, the row address XADD (Ra) of the faulty memory cell and the column address YADD (Cn) of the faulty memory cell.

The main memory 200 reads all the data of the faulty memory region including the faulty memory cell as the backup data based on the command/address signal CA. The backup data may be outputted through the data pad 280 after CAS latency CL, which starts when the read command is inputted. This is described in more detail below.

The row decoder 250 generates the row selection signal XSEL corresponding to the faulty memory region based on the row address XADD (Ra), and the PPR processor 260 generates the normal row selection signal NXSEL based on the row address XADD (Ra) and the row selection signal XSEL. That is, a row line, for example, a word line, corresponding to the faulty memory region is selected. The address wrapper 230 generates the address increase/decrease control signal AWOUT based on the first address wrapping control signal AWEN1. The column decoder 240 generates the column selection signal YSEL corresponding to the faulty memory region based on the column address YADD (Cn) and the address increase/decrease control signal AWOUT. That is, the column decoder 240 first selects the faulty memory cell among the plurality of memory cells included in the faulty memory region, and sequentially selects other memory cells by automatically increasing/decreasing the column address YADD (Cn). The data input/output circuit 270 outputs all the output data DOUT, which are read from the faulty memory region, as the backup data to the data pad 280 based on the read control signal RDEN corresponding to the read command. For example, the plurality of data Dn to Dn+7, Dn−8 to Dn−1 corresponding to the output data DOUT are outputted from the plurality of memory cells included in the faulty memory region, the data Dn is outputted from the faulty memory cell among the plurality of memory cells, and the remaining data Dn+1 to Dn+7, . . . , and then Dn−8 to Dn−1 are outputted from the other memory cells among the plurality of memory cells.

Although FIG. 5 illustrates that 8-bit data Dn to Dn+7, Dn−8 to Dn−1 are repeatedly read as the backup data for each read command, this is only an example. The number of bits of the backup data is a read operational characteristic that depends on design. Thus, the present invention is not limited to 8-bit backup data.

An important feature is that the column address Cn provided from the controller 100 is fixed in the first address wrapping mode, whereas the plurality of data Dn to Dn+7, Dn−8 to Dn−1 corresponding to a plurality of columns are sequentially outputted as the backup data. This is because one column address Cn is automatically increased or decreased by the address wrapper 230.

Figure 6:
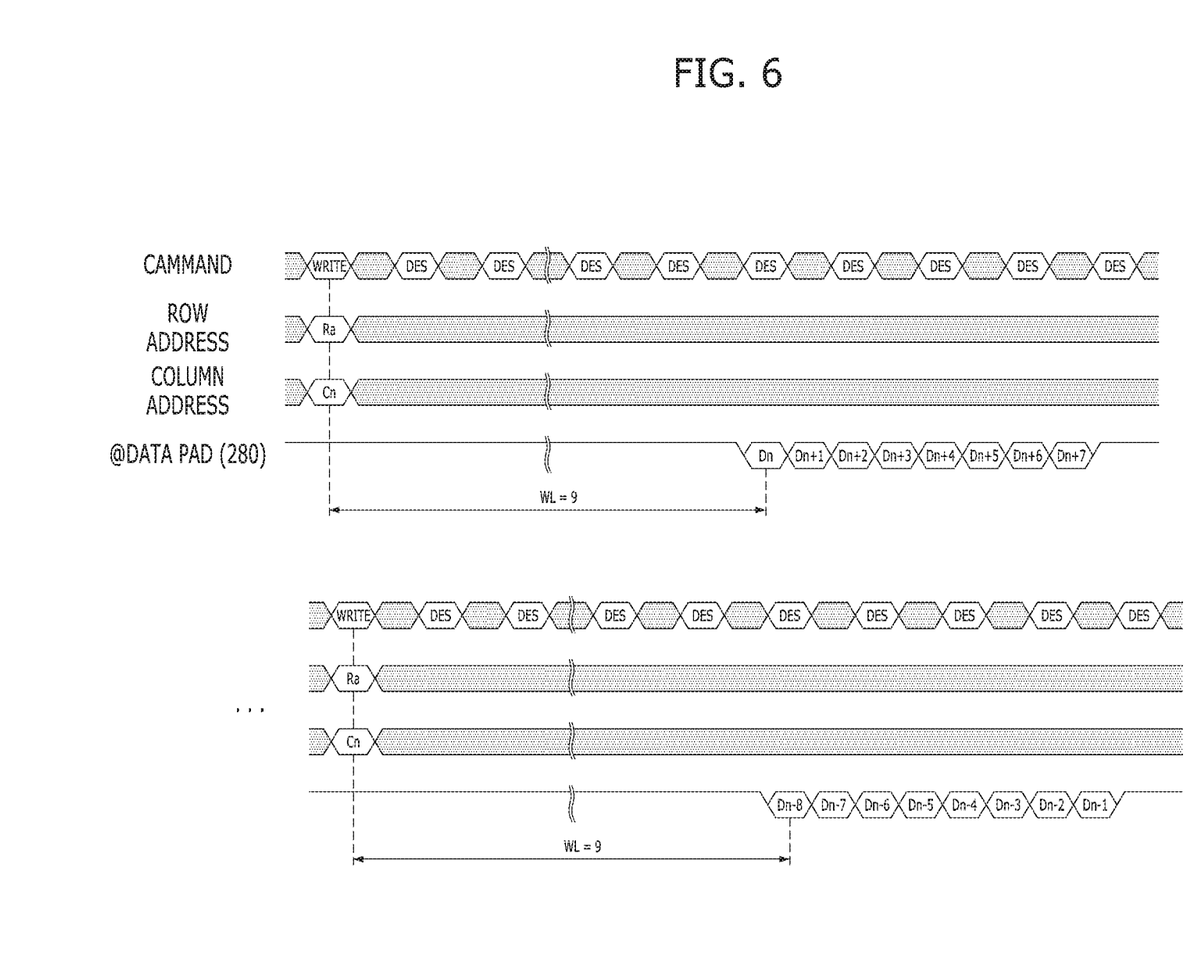
FIG. 6 is a timing diagram illustrating an operation according to a second address wrapping mode in the context of the operation illustrated in FIG. 4, in accordance with an embodiment of the present invention.

FIG. 6 is a timing diagram illustrating an operation according to the second address wrapping mode.

Referring to FIG. 6, when entering the second address wrapping mode, the controller 100 outputs the command/address signal CA to the main memory 200, the command/address signal CA corresponding to a write command, the row address XADD (Ra) of the faulty memory cell and the column address YADD (Cn) of the faulty memory cell.

The main memory 200 receives the backup data, which are temporarily stored in the temporary memory 300, as the restoration data and writes the restoration data, based on the write command and the row address Ra and column address Cn of the faulty memory cell. The restoration data may be inputted through the data pad 280 after write latency WL, which starts when the write command is inputted. This is described in more detail below.

The row decoder 250 generates the row selection signal XSEL corresponding to the faulty memory region based on the row address XADD (Ra), and the PPR processor 260 generates the redundancy row selection signal RXSEL corresponding to the redundancy memory region 213 based on the row address XADD (Ra) and the row selection signal XSEL. That is, a redundancy row line corresponding to the redundancy memory region 213 in lieu of the faulty memory region is selected. The address wrapper 230 generates the address increase/decrease control signal AWOUT based on the second address wrapping control signal AWEN2. The column decoder 240 generates the column selection signal YSEL corresponding to the redundancy memory region 213 based on the column address Cn and the address increase/decrease control signal AWOUT. That is, the column decoder 240 first selects the redundancy memory cell corresponding to the faulty memory cell among the plurality of redundancy memory cells included in the redundancy memory region 213, and sequentially selects other redundancy memory cells by automatically increasing/decreasing the column address YADD (Cn). The data input/output circuit 270 outputs the restoration data as the input data Din to the redundancy memory region based on the write control signal WREN corresponding to the write command. For example, the plurality of data Dn to Dn+7, . . . , Dn−8 to Dn−1 corresponding to the output data DOUT are outputted from the plurality of memory cells included in the faulty memory region, the data Dn is outputted from the faulty memory cell among the plurality of memory cells, and the remaining data Dn+1 to Dn+7, . . . , and then Dn−8 to Dn−1 are outputted from the other memory cells among the plurality of memory cells.

Although FIG. 6 illustrates that 8-bit data Dn to Dn+7, . . . , Dn−8 to Dn−1 are repeatedly written as the restoration data for each write command, this is only an example. The number of bits of the restoration is a write operational characteristic that depends on design. Thus, the present invention is not limited to 8-bit restoration data.

An important feature is that the column address Cn provided from the controller 100 is fixed in the second address wrapping mode, whereas the plurality of data Dn to Dn+7, . . . , Dn−8 to Dn−1 corresponding to a plurality of columns are sequentially inputted as the restoration data. This is because the column address Cn is automatically increased or decreased by the address wrapper 230.

As is apparent from the above description, the memory system in accordance with various embodiments has an advantage in that address mapping is unnecessary because not all the column addresses of the faulty memory region are transferred during the backup operation and the restoration operation; rather, only one address corresponding to the faulty memory cell is transferred. In addition, the memory system can avoid an address twist problem according to the address mapping.

Various embodiments support an address wrapping mode for backing up and restoring data so that a repair operation can be performed more efficiently.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. A main memory comprising:
  a plurality of unit memory regions;
  a redundancy memory region suitable for replacing one or more of the plurality of unit memory regions;
  an address wrapper suitable for generating an address increase/decrease control signal in a first address wrapping mode and a second address wrapping mode;
  a column decoder suitable for sequentially selecting a plurality of memory cells in a faulty memory region where a fault has occurred, among the plurality of unit memory regions, in the first address wrapping mode, and sequentially selecting a plurality of redundancy memory cells in the redundancy memory region in the second address wrapping mode, based on a column address and the address increase/decrease control signal; and
  a data input/output circuit suitable for outputting data read from the faulty memory region, as backup data to a temporary memory in the first address wrapping mode, and storing the backup data inputted from the temporary memory as restoration data to the redundancy memory region in the second address wrapping mode,
  wherein the column decoder first selects a faulty memory cell among the plurality of memory cells based on the column address and sequentially selects the other memory cells by automatically increasing/decreasing the column address in response to the address increase/decrease control signal, in the first address wrapping mode, and wherein the column decoder first selects a redundancy memory cell corresponding to the faulty memory cell among the plurality of redundancy memory cells based on the column address and sequentially selects the other redundancy memory cells by automatically increasing/decreasing the column address in response to the address increase/decrease control signal, in the second address wrapping mode.

2. The main memory of claim 1, further comprising:
a row decoder suitable for generating a row selection signal; and
a post package repair (PPR) processor suitable for selecting, based on the row selection signal, the faulty memory region in the first address wrapping mode and the redundancy memory region in the second address wrapping mode.

3. The main memory of claim 2, wherein the PPR processor replaces a row address of the faulty memory region with a row address of the redundancy memory region in a PPR mode.

4. The main memory of claim 1, wherein each of the unit memory regions and the redundancy memory region includes a plurality of memory cells arranged at one or more rows.

5. A memory system comprising:
a main memory suitable for reading, in a first address wrapping mode, all data of a faulty memory region including a faulty memory cell among a plurality of unit memory regions, as backup data based on a specific address of the faulty memory cell and writing, in a second address wrapping mode, the backup data as restoration data to a redundancy memory region based on the specific address; and
a controller suitable for providing the main memory with the specific address in the first and second wrapping modes,
wherein the main memory first selects the faulty memory cell based on the specific address, and sequentially selects other memory cells within the faulty memory region by automatically increasing or decreasing an address value starting from the specific address, in the first address wrapping mode, and
wherein the main memory first selects a redundancy memory cell corresponding to the faulty memory cell within the redundancy memory region based on the specific address, and sequentially selects other redundancy memory cells within the redundancy memory region by automatically increasing or decreasing an address value from the specific address, in the second address wrapping mode.

6. The memory system of claim 5, wherein the specific address includes a specific column address.

7. The memory system of claim 5, wherein the main memory replaces a row address of the faulty memory region with a row address of the redundancy memory region in a post package repair (PPR) mode.

8. The memory system of claim 5, further comprising a temporary memory suitable for temporarily storing the backup data under the control of the controller.

9. The memory system of claim 5, further comprising an error correction code (ECC) engine suitable for generating ECC information indicating whether the fault is present.

10. The memory system of claim 5, wherein the controller includes:

an address storing circuit suitable for storing the specific address;
an address wrapping control circuit suitable for detecting the faulty memory cell based on read data and ECC information, and controlling a backup operation and a restoration operation of the main memory according to the detection result; and
a PPR control circuit suitable for controlling the main memory device to perform a post package repair (PPR) operation between the backup operation and the restoration operation.

11. The memory system of claim 5, wherein each of the unit memory regions and the redundancy memory region includes a plurality of memory cells arranged at one or more rows.

12. An operating method of a memory system, the operating method comprising:
selecting, in a first address wrapping mode, a faulty memory cell among a plurality of memory cells in a faulty memory region where a fault has occurred, among a plurality of unit memory regions, based on the column address, and sequentially selecting the other memory cells of the plurality of memory cells by automatically increasing/decreasing the column address in response to an address increase/decrease control signal;
selecting, in a second address wrapping mode, a redundancy memory cell corresponding to the faulty memory cell among a plurality of redundancy memory cells in a redundancy memory region, based on the column address, and sequentially selecting the other redundancy memory cells of the plurality of redundancy memory cells by automatically increasing/decreasing the column address in response to the address increase/decrease control signal;
reading all data of the plurality of memory cells in the faulty memory region as backup data;
replacing the faulty memory region with the redundancy memory region; and
writing the backup data as restoration data to the plurality of redundancy memory cells in the redundancy memory region.

13. The operating method of claim 12, wherein the address includes one column address.

14. A memory system comprising:
a temporary memory; and
a main memory which includes:
a cell array including a normal memory region and a redundancy memory region;
an address wrapper configured to generate an address increase/decrease control signal;
decoding circuitry; and
a data input/output circuit,
wherein:
in a first address wrapping mode,
the decoding circuitry sequentially selects faulty memory cells where a fault has occurred, in the normal memory region, the faulty memory cells including a particular faulty memory cell and the other faulty memory cells, the particular faulty memory cell being selected based on a column address and a row address, and the other faulty memory cells being selected based on the column address and the address increase/decrease control signal, and the data input/output circuit reads data from the faulty memory cells, and outputs the read data as backup data to the temporary memory, and in a second address wrapping mode, the decoding circuitry sequentially selects redundancy memory cells in the redundancy memory region, the redundancy memory cells including a particular redundancy memory cell and the other redundancy memory cells, the particular redundancy memory cell being selected based on the column address and the row address, and the other redundancy memory cells being selected based on the column address and the address increase/decrease control signal, and the data input/output circuit inputs the backup data from the temporary memory, and stores the backup data as restoration data to the redundancy memory cells.

15. A method for operating a memory system including a cell array including a normal memory region and a redundancy memory region, the method comprising:

in a first address wrapping mode, sequentially selecting faulty memory cells where a fault has occurred, in the normal memory region, the faulty memory cells including a particular faulty memory cell and the other faulty memory cells, the particular faulty memory cell being selected based on a column address and a row address, and the other faulty memory cells being selected based on the column address and an address increase/decrease control signal, reading data from the faulty memory cells, and outputting the read data as backup data to a temporary memory; and in a second address wrapping mode, sequentially selecting redundancy memory cells in the redundancy memory region, the redundancy memory cells including a particular redundancy memory cell and the other redundancy memory cells, the particular redundancy memory cell being selected based on the column address and the row address, and the other redundancy memory cells being selected based on the column address and the address increase/decrease control signal, inputting the backup data from the temporary memory, and storing the backup data as restoration data to the redundancy memory cells.

\* \* \* \* \*